(12) United States Patent
Coronel et al.

(10) Patent No.: US 6,815,828 B1
(45) Date of Patent: *Nov. 9, 2004

(54) LARGE MULTI-FUNCTION INTEGRATED CIRCUIT DEVICE

(75) Inventors: Ramon Coronel, Torrance, CA (US); Karen A. Fucik, Redondo Beach, CA (US); Peter S. Yoon, Torrance, CA (US); Donald G. Heflinger, Torrance, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 360 days.

This patent is subject to a terminal disclaimer.

(21) Appl. No.: 09/618,708

(22) Filed: Jul. 18, 2000

(51) Int. Cl.⁷ .............................................. H01L 23/48
(52) U.S. Cl. ...................................... 257/777; 385/24
(58) Field of Search ........................... 257/777; 385/10

(56) References Cited

U.S. PATENT DOCUMENTS

| | | | | |
|---|---|---|---|---|
| 5,140,152 A | * | 8/1992 | Van Zeghbroeck | 250/214 A |
| 5,511,083 A | * | 4/1996 | D'Amato et al. | 372/6 |
| 5,568,574 A | * | 10/1996 | Tanguay, Jr. et al. | 385/14 |
| 5,612,563 A | * | 3/1997 | Fitch et al. | 257/329 |
| 5,705,047 A | * | 1/1998 | Lee | 205/123 |
| 5,731,596 A | * | 3/1998 | Jandel | 257/15 |
| 5,793,115 A | * | 8/1998 | Zavracky et al. | 257/777 |
| 6,458,614 B1 | * | 10/2002 | Nanishi et al. | 438/31 |

* cited by examiner

Primary Examiner—Douglas Wille
(74) Attorney, Agent, or Firm—Ronald M. Goldman; Connie M. Thousand

(57) ABSTRACT

An integrated circuit device includes a thin semiconductor layer disposed on a surface of a wafer, a plurality of wafer-scale integrated (WSI) circuits formed on the semiconductor layer, and a node formed on the semiconductor layer that provides an optoelectronic interface to an axial optical data bus for high-speed optical interconnectivity between the WSI circuits and other external devices interconnected to the optical data bus.

38 Claims, 6 Drawing Sheets

LARGE MULTI-FUNCTION INTEGRATED CIRCUIT DEVICE

CROSS REFERENCES

This invention is related to patent applications Ser. No. 09/123,136, filed Jul. 27, 1998, entitled "Solid-State Spacecraft With Minimal Moving Parts" by inventors H. Eller and R. Coronel, Ser. No. 09/336,019, filed Jun. 18, 1999, entitled "Broadcast Optical Communication System Employing Waveguide Having Grating Normal To Sources And Detectors" by inventor D. Heflinger and patent application, filed simultaneously with present invention, entitled "Pseudomonolithic Wafer Scale Module" by inventors R. Coronel et al., all of which are assigned to the same assignee as the present invention, and the disclosures of which are incorporated herein.

BACKGROUND OF THE INVENTION

1. Field of the Invention

The present invention relates generally to integrated circuit devices and, more specifically to an integrated circuit device that includes self-testing, fault-tolerant electronic and optoelectronic circuit components that are suitable for hardware reduction utilizing wafer-scale integration techniques. The integrated circuit device of the present invention also includes a high-speed optoelectronic interface to an axial optical data bus used to provide optical interconnectivity between the integrated circuit device components and other external devices.

2. Description of the Prior Art

Conventionally, the manufacture of integrated circuits is accomplished by simultaneously fabricating a plurality of identical circuits on a single wafer. The wafer is later scribed into a plurality of chips that are separately packaged and later integrated into a larger system. The total cost of such a system includes costs associated with the packaging of each individual chip and any costs associated with the increase in the system bulk because packaged chips are substantially larger than the chips themselves. And, the larger and more integrated a system becomes the greater the cost. For example, spacecraft avionics systems are large integrated systems having circuits built from conventional electronic chips and components. The chips are produced and packaged by many different manufacturers and therefore, the circuits are typically much larger than is necessary to perform each circuit's intended function. These packaged chips may be placed into several spacecraft avionics units where each unit contains a specific function required for the given spacecraft system. The number of spacecraft avionics units required for a particular system is typically large and the units may require harness (wire cable) interconnections that are mounted onto the spacecraft structure. The quantity, size, and interconnections required of such units necessitates spreading the units over a large physical area, thereby, preventing satellites or similar spacecraft from being compact and lightweight structures.

Wafer-scale integration has been described in the art as a method for alleviating individual chip packaging and integration by including all of the processing required for a particular function in a single integrated circuit formed on a single semiconductor wafer. It has further been described in the art as a means for meeting the demands of high-speed processing since, by including all of the processing means of a particular application in a single integrated circuit, short and high-speed interconnections may be formed. However, wafer-scale integration is not without its disadvantages since defects due to the presence of impurities in the semiconductor crystal structure can occur and such defects can prevent individual circuit components located on the area of the defect from functioning properly. The larger the surface area of the wafer, the greater the number of defects; therefore, the ability to increase the wafer size to accommodate larger and larger systems is obviated in the absence of a defect-free wafer.

Various means of detecting and bypassing wafer defects have been utilized to mitigate the effects that such defects have on wafer-scale integrated circuits. Generally, the if operative circuits or devices on a wafer are electrically isolated from the inoperative devices through the use of discretionary connections. For example, U.S. Pat. No. 5,514,884 discloses a method of using multiple identical blocks of addressable circuitry that are tested prior to interconnection to compensate for the defects in a wafer-size integrated circuit. The multiple identical blocks of circuit elements and multiple identical blocks of control logic are provided on a wafer where both the blocks of circuit elements and the blocks of control logic are small enough that blocks found to be defective can be discarded without significantly reducing the size of the device. U.S. Pat. No. 5,274,264 discloses a defect tolerant power distribution network for wafer-scale integrated circuits, and a method for detecting and removing short circuits from the network. Portions of the conductive lines in the power distribution network are fabricated with an area whose width is reduced relative to the remainder of the line. The amount of reduction in the line is sufficient to produce a hot spot in response to current flow to a short circuit that is located at an electrically downstream location on the line. Upon locating the hot spot as being associated with a specific circuit, the shorted circuit is removed from the remainder of the network by such means as laser cutting. U.S. Pat. Nos. 5,498,886 and 5,576,554 disclose forming a plurality of circuit modules on a wafer and grouping the modules into blocks arranged on a rectangular grid. An interconnect network including signal lines and power lines, each with built-in redundancy, surrounds each block. Each module and each segment of the interconnect network are tested and, by using fusible links, the defect-free segments of the interconnect network are connected to the functional circuit modules. U.S. Pat. No. 5,430,734 discloses an integrated circuit device that includes a wafer containing dynamically configurable gate arrays. The device provides a fault-tolerant design that addresses manufacturing defects by mapping all defective gate arrays and defective portions of each gate array on the wafer. Such defect mapping occurs during initial wafer testing following the wafer fabrication and the mapping information is later used to program the desired wafer functions to exclude defective portions of the wafer. U.S. Pat. No. 5,140,189 discloses creating externally formed connections to a wafer-scale semiconductor device to avoid wafer level defects located at various sites on the wafer. In particular, small external shorting blocks or patch circuits are utilized to define spare sites that may be used as replacement sites for defective primary sites. The patch circuit is used in combination with a decoder circuit that is coupled to a predetermined number of spare sites on a fully processed wafer-scale integrated (WSI) wafer. The decoder contains one enabling output for each spare site so that connections completed by the shorting block or patch circuit can assign a logical address for a defective primary site to a designated spare site. Control circuits also exist in the wafer to electrically remove one or more defective primary sites and to activate a required number of spare sites that operate as replacement sites for the defective primary sites. U.S. Pat.

No. 5,084,838 discloses a plurality of integrated circuits mounted on a large-scale integrated circuit device that are each provided with a bypass circuit that selectively shorts input and output nodes in the corresponding unit integrated circuit. By selectively bringing the bypass circuit into a transfer state, all unit integrated circuits that are judged to be normal among a plurality of unit integrated circuits disposed along one row are coupled together.

To avoid testing individual circuits and manually connecting circuits to bypass defective circuit components, U.S. Pat. No. 5,287,345 discloses an array of interconnected node units formed as an integrated circuit on a semiconductor wafer for use in data handling, data processing or data storage. Each node unit includes a controlled switch for routing signal packets to destination node units whose addresses are included in the packets and also includes an automatic self-test function that, following satisfactory completion of the self-test, transmits a signal to adjacent node units that it is functioning properly. The controller of a node unit switch stores datum concerning which adjacent node units are defective and directs signal packets on paths around the defective node units.

Notwithstanding that defect avoidance techniques, like those previously described, may be necessary to produce operative wafer-scale integrated circuits, such techniques may not, by themselves, be acceptable for wafer-scale integration that meets the demands of applications requiring increased processing speed and performance, as well as increased integration density of microelectronic components. Such applications, e.g. avionics systems and other similarly larger and complex systems, could potentially require considerably large wafers. And, as previously described, increases in wafer size (or wafer surface area) are accompanied by proportional increases in the number of wafer defects. Therefore, the number and complexity of constructs used to mitigate such defects must likewise be increased. As a result, practical limitations on the size of single wafers may be necessary to avoid sacrificing wafer yield and processing efficiency.

What is needed, therefore, is a wafer-scale integrated circuit device that can utilize a built in capacity to self-test for defect induced circuit failure conditions and accommodate a means for the complete repair of the integrated circuit device and, further provide a high-speed data communication interface to external devices, e.g. other similar wafer-scale integrated circuit devices, to enable the functions of large-scale systems that are not assumable by a single wafer-scale integrated circuit device to be distributed among multiple such devices without sacrificing speed and processing efficiency.

SUMMARY OF THE INVENTION

The preceding and other shortcomings of the prior art are addressed and overcome by the present invention that provides an integrated circuit device. The device includes a wafer having a first surface, a second surface opposite the first surface, an optical transmission interface extending from the first wafer surface through to the second wafer surface, a semiconductor layer disposed on the first wafer surface, and a plurality of integrated circuits formed on the semiconductor layer. An optical data bus extends through the optical transmission interface normal to the first wafer surface and a plurality of devices are coupled to the optical data bus. To provide optical coupling between the plurality of integrated circuits and the optical data bus, a node is formed on the semiconductor layer adjacent to the optical transmission interface. Alternatively, the foregoing optical transmission interfaces may be omitted and the node formed at an edge of the wafer such that the optical data bus is extended along the edge of the wafer normal to the first wafer surface, defining a different optical interface.

In an alternate embodiment of the present invention, an integrated circuit device is provided that includes a plurality of adjacently stacked wafers, each wafer having a first surface, a second surface opposite the first surface and an optical transmission interface extending from the first surface through to the second surface, a semiconductor layer disposed on each first water surface, and a plurality of integrated circuits formed on each semiconductor layer. The plurality of integrated circuits include a node formed on the semiconductor layer adjacent to the optical transmission interface to couple optical data into and out of the plurality of integrated circuits. An optical data bus is included for coupling optical data between one wafer node and other nodes of wafers within the stack. The optical data bus extends axially through each of the optical transmission interfaces normal to each first wafer surface at each node. Alternatively, the foregoing type of optical transmission interfaces may be omitted and the nodes formed at an edge of each wafer such that the optical data bus extends along the edge of each wafer normal to each of the first wafer surfaces to form different interfaces therebetween. The integrated circuit device also includes the capability to replace defective wafers found in the stack of wafers.

BRIEF DESCRIPTION OF THE DRAWINGS

Reference is now made to the following description and attached drawings, wherein:

FIG. 2b is a three-dimensional exploded view of the integrated circuit device node and the optical data bus shown in FIG. 2a;

DETAILED DESCRIPTION OF THE INVENTION

Figure 1:
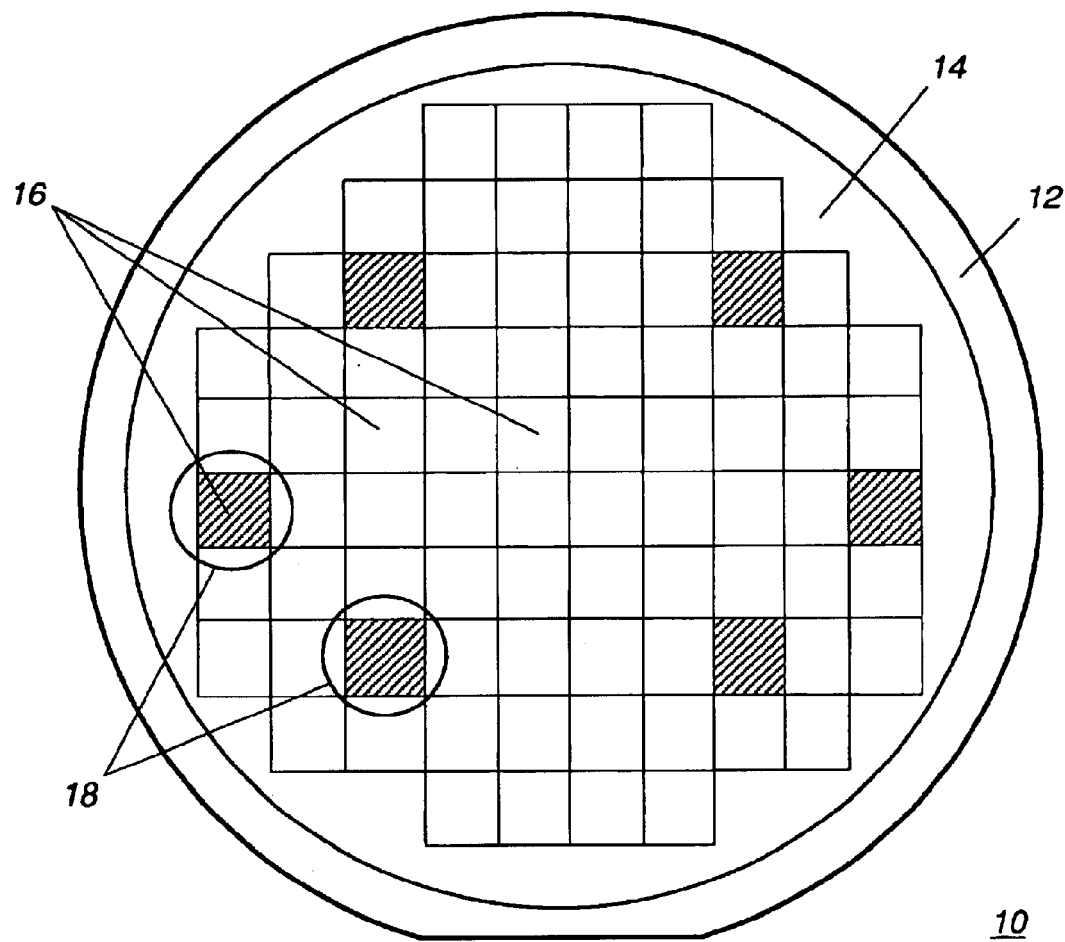
FIG. 1 is a plan view illustration of an integrated circuit device in accordance with the present invention.

Referring to FIG. 1, a plan view of an integrated circuit device 10 is illustrated. The integrated circuit device 10 includes a wafer 12 and a semiconductor layer 14 formed thereon. The wafer 12 may be formed from a material having a relatively high thermal conductivity, such as diamond or sapphire. The semiconductor layer 14 is generally planar, and composed of silicon, germanium, gallium arsenide, indium phosphide, gallium phosphide, indium arsenide, or a similar material. The semiconductor layer 14 has a thickness of from approximately 10 microns to 50 microns, and includes thousands of integrated circuits 16 or components formed by monolithic wafer-scale integration (WSI) techniques. The integrated circuits 16 particularly comprise application specific integrated circuits (ASICs) and also comprise optoelectronic components that provide communication interface nodes 18 for high-speed optical data communication between the integrated circuits 16 and external devices, for example other stacked wafers 12. Although including integrated circuits for fault recovery is not necessary to practice the present invention, the integrated circuits 16 may include such circuits to mitigate the effects of onboard wafer defects. There are numerous fault recovery techniques known in the art that can be employed with this invention, including the techniques disclosed by U.S. Pats. No. 4,653,050, 5,185,050, 5,216,637 and 5,299,202, all assigned to the assignee of the present invention. Using these techniques, the fault recovery circuitry can repair an individual wafer to make it perform as if it were defect free, or it can identify a wafer defect so that the wafer can be replaced with a non-defective wafer, as illustrated in FIG. 5.

Figure 2A:
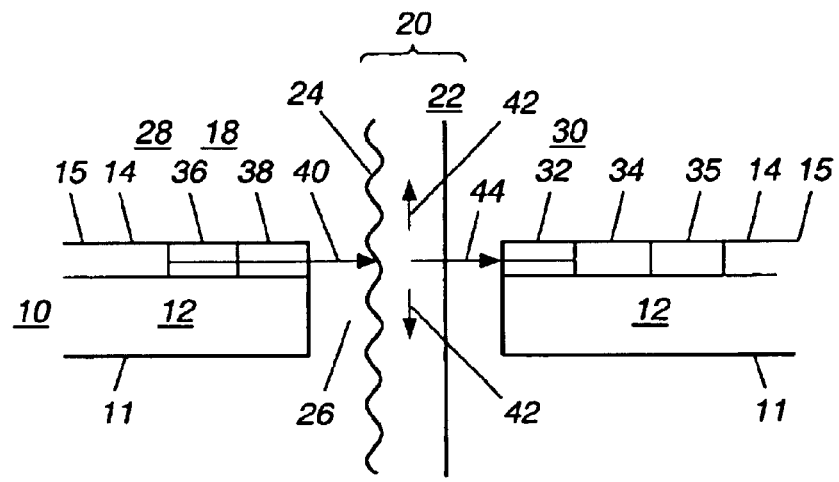
FIG. 2a is a diagrammatic view of the interface between an integrated circuit device node and an optical data bus in accordance with the present invention.
Figure 2B:
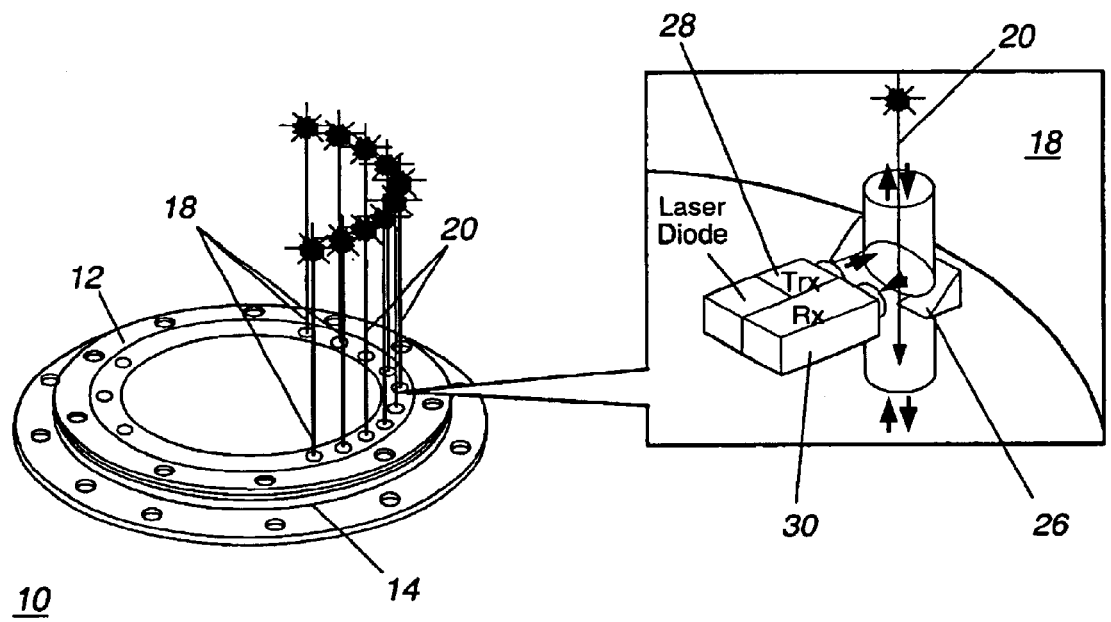

Referring to FIGS. 2a and 2b, to provide interconnectivity between the wafer circuitry 16 and external devices (not shown), each wafer node 18 includes a transmitter circuit 28 and a receiver circuit 30. For purposes of the present invention, a single node 18 (transmitter/receiver circuit pair) or multiple nodes may be formed on the wafer 12. In the single node embodiment, a single optical data bus 20 or waveguide 22 (described below) extends at the node 18 through an optical transmission interface 26 to facilitate a single-channel broadcast architecture between the wafer 12 and external devices. Alternatively, the nodes 18 can be placed on the edge of the wafer 12.

Figure 2C:
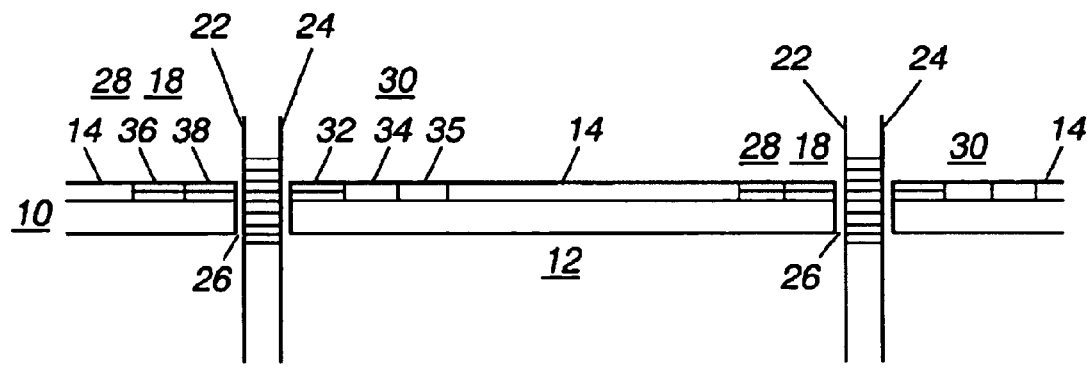
FIG. 2c is a diagrammatic view of the integrated circuit device having multiple device nodes and multiple optical data buses.

Referring to FIG. 2c, however, a preferred embodiment of the present invention includes the wafer 12 having multiple nodes 18. In this embodiment, multiple optical waveguides 22 or optical data buses 20 extend at multiple nodes 18 through optical interfaces 26 to facilitate a multi-channel broadcast architecture between the wafer 12 and the external devices. Here, as in the single node embodiment, the nodes 18 can alternatively be placed on the edge of the wafer 12.

Figure 2D:
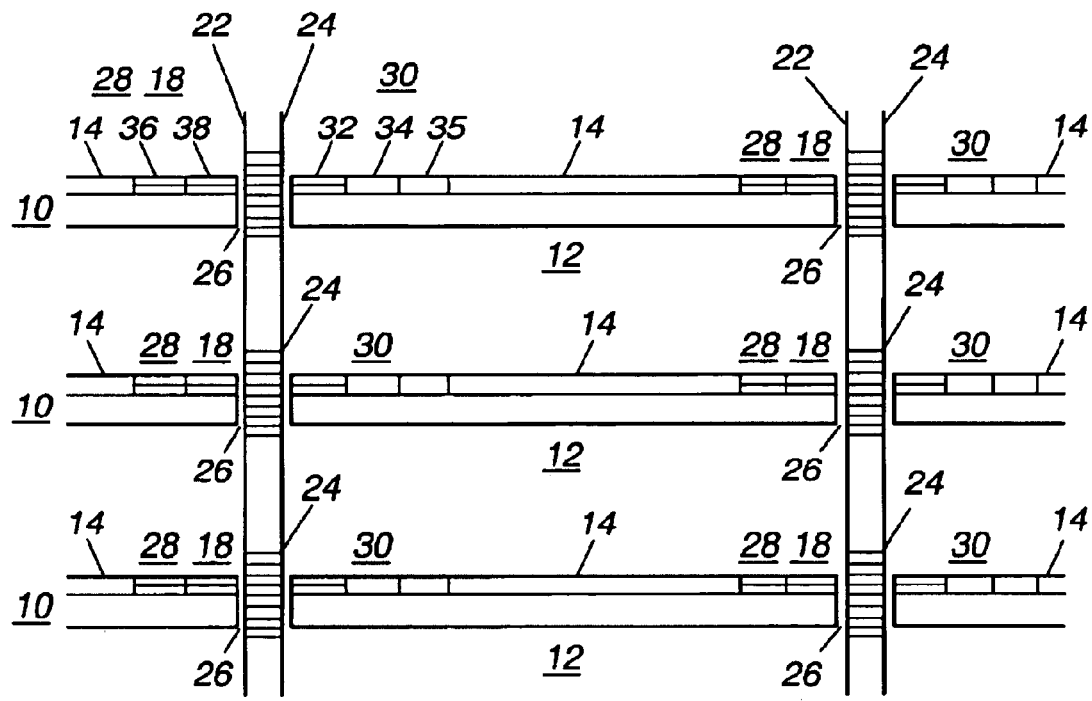
FIG. 2d is a diagrammatic view of the interfaces between multiple stacked wafer integrated circuit devices and multiple optical data buses in accordance with an embodiment of the present invention.

Referring to FIG. 2d, for purposes of illustrating an alternate embodiment of the present invention described in detail below, the external devices previously mentioned are preferably, but not necessarily other wafers 12 placed in a stacked configuration.

Referring again to FIG. 2a, data output from the transmitter circuit 28 normal to the optical data bus 20, shown by numeral 40, is propagated bi-directionally through the data bus 20 and is received by all external devices located along the optical data bus 20; and, data propagating through the optical data bus 20 from an external device is coupled out of the optical data bus 20 into free space for detection by the receiver circuit 30, as shown by numeral 44. The optical data bus 20, preferably a vertical integrated optical data bus (VIODB), comprises an optical waveguide 22 having a plurality of gratings 24, such as Bragg gratings. The data bus 20 extends through an optical interface 26 normal to the plane of the wafer 12 and hence to the transmitter and receiver circuits (28, 30) so that a grating coupler 24 of the data bus 20 is located at each transmitter/receiver pair, also referred to as the node 18. The optical data bus 20 does not require physical contact between the optical interface 26 and the waveguide 22, allowing for a connectorless interface at each node 18. Additionally, the grating coupler 24 does not require a critical optical alignment to perform the optical coupling of light in and out of the waveguide 22. Each grating 24 serves to Bragg diffract the normally incident light beam 40 and launch it bi-directionally in equal amounts within the waveguide 22. Conversely, when the guided mode of the propagating light beam reaches any grating 24 within the waveguide 22, these recipient gratings 24 Bragg diffract and couple portions of the progagating light out of the waveguide 22 into free space regions, as shown by numeral 44.

The transmitter circuit 28 comprises a light source 36 for emitting a coherent, monochromatic beam of light 40, and an external modulator 38. The light source 36 is preferably incorporated as a hybrid element onto the semiconductor layer 14 at the node 18. Alternatively, the light source 36 may be grown epitaxially on the layer 14 using regrowth of gallium arsenide, indium phosphide or a like semiconductor material on silicon technology, or it may be formed from porous silicon optical emitters. The light source 36 is disposed adjacent to the external modulator 38 and the external modulator 38 is disposed proximate the optical interface 26 in the wafer 12 which extends from a first wafer surface 11 through to an opposite second wafer surface 15. The location of the light source 36 is such that the light 40 it transmits from its edge propagates in a direction parallel to the surface of the wafer 12 towards the grating 24. The transmitted coherent monochromatic light 40 has a cross section that diverges as it propagates. This divergence leads to a reduced coupling efficiency with the waveguide 22 but allows for greater alignment tolerance.

To illustrate how data is transferred to the optical transmitter 28 from the remaining circuitry 16, transmitter driving circuitry (not shown) is included as part of the integrated circuitry 16 of the wafer 12. This circuitry electrically drives the optical transmitter 28 to deliver light when the input signal is a digital "one" and electrically drives the optical transmitter 28 to deliver no light when the input signal is a digital "zero." This electrical drive can be applied either to the light source 36 or preferably to the external modulator 38 to achieve these optical outputs. The data transferred to the transmitter driving circuitry from the remaining integrated circuitry 16 is comprised of a digital serial data stream of "ones" and "zeros" represented by two distinct voltage states respectively. This data stream is preferably from a single bit in a parallel digital word, in which case there are additional optical data bus nodes 18 for each of the remaining bits in the parallel digital word. Alternatively, the parallel digital words can be electrically transferred into a higher rate serial data stream using a parallel loading digital shift register (not shown). Once the parallel word is loaded into the shift register, the data is shifted over one data bit at a time across the entire register before the next parallel word is loaded, in order to deliver a serial data stream to the transmitter driver circuit for the optical transmitter 28.

Referring still to FIG. 2a, the external modulator 38 is preferably an electro-absorption laser diode modulator that has a discrete channel spectrum of from 1300 nanometers (nm) to 1600 nanometers (nm) and preferably, though not mandatory, capable of producing an optical signal having data rates above 10 Gbps. The electro-absorption modulator 38 is integrated into the semiconductor layer 14 and is made from the same semiconductor material as the light source 36. Alternatively, the modulator 38 may be made from any materials that are highly compatible with gallium arsenide, indium phosphide, or similar technology, and which have been used for millimeter wave integrated circuits, such as indium, gallium, aluminum, arsenide, and phosphide.

The receiver 30 includes at the node 18, a detector 32, an amplifier 34 and signal processing circuitry 35. The detector 32 is positioned proximate to and at the edge of the optical interface 26 facing the grating 24 and the light source 36. The detector 32 detects the emitted optical signals and converts them into an electrical signal that is amplified by the amplifier 34 and later processed by the signal processing circuitry 35. The amplifier 34 and signal processing circuitry 35 are part of the integrated circuitry 16 of the wafer 12. The signal processing circuitry 35 limits the electrical signals delivered by the amplifier 34 to a voltage that represents digital "ones" in the intervals where light is transmitted, and digital "zeros" in the intervals where no light is transmitted. The serial data stream delivered by the signal processing circuitry 35 is preferably used as the data corresponding to a particular data bit in a digital parallel word. In this case, there are additional optical data bus nodes 18 for each of the remaining bits in the parallel digital word. Alternatively, the serial data stream delivered by the processing circuitry 35 can be electrically loaded into a serial input shift register (not shown) and read out as a parallel word after an entire register of serial data has been clocked in from the processing circuitry 35. As will be described later, the light 44 output coupled out from the grating 24 is collimated into a narrow beam constrained to a plane normal to the waveguide 22 by the extended grating aperture.

The optical waveguide 22 is a dielectric slab made from an optically transparent material, such as glass, a polymer material, or an optical semiconductor, and supports a characteristic propagating mode or modes. It has an index of refraction $n_2$ and a periodic Bragg surface grating 24. Mask techniques or holographic interference techniques are used to make the periodic Bragg gratings 24 on the surface of the slab. The Bragg surface grating 24 has a period, $\Lambda$, and serves to Bragg diffract and couple the incident light transmitted by the light source 36 and delivered by the external modulator 38 into a propagating mode of the waveguide 22 that conveys the light axially and bi-directionally through the dielectric slab waveguide 22 as illustrated by the arrows numbered 42 in FIG. 2a. This light 42 is launched equally in both directions. At each grating 24 a portion of the light 42 flowing axially through the slab is Bragg diffracted and coupled out of the waveguide 22 in a direction normal thereto (shown by numeral 44 in FIG. 2a) and hence through the surrounding air and into the detector 32. Since the light 42 propagates in both directions all device detectors 32 receive some of the propagating incident light flowing through the waveguide 22. In this way, detectors 32 in all the other external devices receive the data contained in the optical signal transmitted by the transmitter 28 at the node 18. The grating 24 allows for coupling from both sides of the waveguide 22, enabling the transmitter 28 to be positioned on one side of the optical interface 26 and the receivers 30 to be positioned on the opposite side of the node 18.

Figure 3:
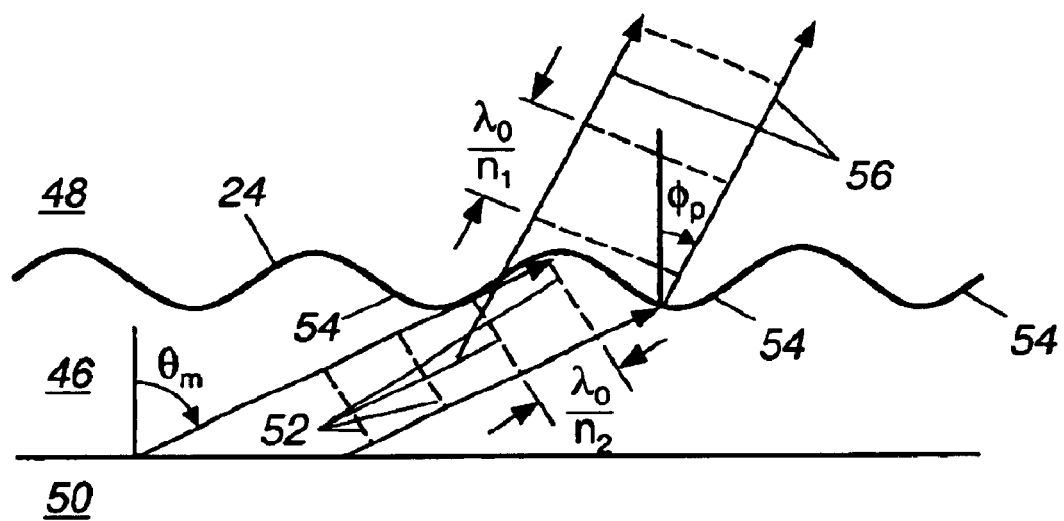
FIG. 3 is a diagrammatic view illustrating light coupling out of an optical data bus grating coupler.

Referring to FIG. 3, the dielectric slab waveguide 22 comprises three adjacent layers of optically transparent material with refractive index $n_2$ of the middle core layer 46 being greater than the refractive indices $n_1$ and $n_3$ of the two outer cladding layers, 48 and 50 respectively.

The guided propagating modes will depend on the wavelength of light, $\lambda_0$, the indexes of refraction of each layer, $n_1$, $n_2$, and $n_3$, and the thickness d of the core layer 46 which corresponds to the distance between the upper layer 48 and the lower layer 50. Because the propagating mode in the dielectric waveguide has evanescent electric field tails that extend from the core into the cladding, the periodic grating 24 at the interface between the core 46 and the cladding Bragg diffracts the propagating light out of the waveguide 22.

The rays of the propagating mode of light approach the grating at the allowed angles for propagation denoted by $\theta_m$. This angle of approach establishes a wavefront 52, denoted in FIG. 3 by the wavefront spacing given by $\lambda_0/n_2$, that is scattered from the periodic grooves 54 of the grating 24. Each groove 54 in the grating 24 scatters light in all directions out of the waveguide 22. When adjacent grooves are driven by light that has a fixed phase lag set by the propagation angle of incidence, the scatter direction of adjacent grooves is constructive and adds up in phase for one particular output coupling angle, $\phi_p$, as shown by arrows 56. At this output coupling angle, $\phi_p$, the light is launched out of the waveguide 22 to propagate in free space with a wavefront spacing noted in FIG. 3 as $\lambda_0/n_1$.

The relation for this grating output coupled light is given in terms of the angle of the propagating mode, $\theta_m$, the wavelength of light, $\lambda_0$, the period of the grating, $\Lambda$, and the refractive indexes $n_1$, and $n_2$ of the two layers (46, 48) respectively that form the grating interface as, $$n_2 \sin \theta_m + n_1 \sin \phi_p = p\lambda_0/\Lambda \qquad (1)$$

where p is the output coupled order. It is important to note that the grating coupling expression given by equation (1) does not include refractive index $n_3$ because the light never propagates in the bottom layer 50.

The above description has been described for the case of the grating output coupler. Since light has a reciprocity property, the above description and equation also describe the conditions for input coupling light from free space into a propagating mode of the waveguide. Thus, the same grating period is used for both output coupling and input coupling.

In accordance with the present invention, a special condition exists when the grating output coupling angle, $\phi_p$, is zero degrees or at an angle perpendicular to the waveguide. For this case, equation (1) becomes, $$n_2 \sin \theta_m = \lambda_0/\Lambda \qquad (2)$$

This expression is the second order Bragg condition for a propagating mode of light to become reflected back on itself within the waveguide 22. So at this normal angle of grating output coupling, the light inside the waveguide 22 happens to also scatter constructively into a mode that is guided by the waveguide 22 and propagates in the opposite direction of the original propagating light. In the case of input coupling, the light is simultaneously launched into the waveguide in both propagating directions (see numeral 42 in FIG. 2a). This enables simultaneous broadcast to all the nodes located on the optical data bus 20.

The scattering effect described above pertains to grating coupling light via a Bragg interaction with the corrugated periodic set of surface grooves 54 shown in FIG. 3. The same effect occurs from a periodic variation of the refractive index in the core region of the dielectric waveguide, such as in a volume Bragg grating formed in an optical fiber. In this case, intense light at short ultraviolet wavelengths is used to chemically change the glass inside the core of the optical fiber and result in a refractive index change. By making this change occur in a periodic way through the well-known use of optical interference and holographic techniques, a volume grating is made inside the core of the optical fiber. This volume grating produces the same effect on the light propagating inside the core as the surface grating. Thus, volume Bragg gratings formed in optical fiber can be used for the dielectrical optical waveguide with the grating couplers in this invention.

Equation (2) is valid for light that impinges at exactly normal incidence, that is when $\theta_p=0$ in equation (1). This condition is easily met by a fraction of the light transmitted by a laser diode when the plane of the emitting junction of the laser diode is oriented perpendicular to the propagation direction of the dielectric waveguide. Since the aspect dimension of the emitting junction of the laser diode is small in a direction perpendicular to the plane of the junction, the emitted light diffracts over an angular spread of typically 30 degrees in a direction perpendicular to the junction plane. By orienting the dielectric waveguide with its length along this angular spread, a portion of the incident light is always oriented at exactly normal incidence and thus can grating couple into the dielectric waveguide in both directions. The angular spread of 30 degrees delivered by the optical source greatly reduces the alignment tolerance required of the optical sources. It is this additional freedom of optical alignment that can allow the waveguide 22 to be removed for purposes of replacing a wafer having an onboard defect, as later described and illustrated in FIG. 5.

The light emitted from the external modulator 38 will also diffract over an angular spread of typically 30 degrees in a direction perpendicular to the junction plane. This is because the aspect dimension of the emitting junction of the external modulator 38 is small in a direction perpendicular to the plane of the junction. Since the junction plane is grown parallel to the plane of the wafer 12, the emitted light from the modulator 38 will also be spread along the length of the dielectric waveguide just as was the case for a laser source. Thus, there will be a reduced alignment tolerance of the external modulators also.

In a similar way, the light that is output coupled from the grating coupler experiences a similar diffraction that again reduces alignment tolerance of the detector 32. The light is emitted, according to equation (2), at an angle that is exactly normal to the dielectric waveguide surface, i.e. when $\phi_p=0$ in equation (1). This means that the detector must be positioned in a plane that is exactly normal to the dielectric waveguide. However, due to the narrow extend of the grating coupler in a direction parallel to the normal plane, there will be diffraction of the output coupled light causing an angular spread within the normal plane. This angular spread reduces the placement tolerance required of the photodetector within the plane. In addition, the fact that the output coupled light has a narrow angular spread in a direction that is perpendicular to the normal plane helps to direct the light to where the photodetector is positioned, thus increasing detection efficiency. Thus, it is this tolerant optical alignment that would allow the waveguides 22 to be removed, for example, when wafer replacement is necessary to remove a defective wafer from a stack of wafers 12 (see FIG. 5).

The dielectric slab waveguide 22 may alternatively comprise a thin sliver of dielectric material that enables guided mode propagation. In this configuration, the surrounding air, having a lower refractive index than the thin sliver of dielectric material, provides for total internal reflection of the propagating mode and serves as the outer layer of the waveguide. The use of air interfaces as part of the waveguide greatly simplifies the manufacture of the dielectric waveguide with its grating coupler.

The dielectric slab waveguide 22 may also be comprised of an indium gallium arsenide phosphide (InGaAsP) semiconductor material that is transparent to a wavelength of 1.32 µm. This is a commonly used wavelength delivered by semiconductor lasers made of the same material. Here, $n_1=1.0$, $n_2=3.35$ and $n_3=3.2$, where the composition of the layers of the InGaAsP semiconductor have been appropriately adjusted to achieve these refractive indexes. The core layer thickness is d=0.8 µm which sets up a propagating mode with a ray tracing or propagation angle $\theta_m$ of 79.6 degrees. By using a grating period of 0.4005 µm a grating coupler is formed that will deliver light normal to the waveguide surface or couple light incident normally to the surface in both directions in the waveguide.

Additionally, the optical waveguide may comprise an optical fiber (single mode SMF-28 fiber) dielectric waveguide in which the refractive indexes of a glass optical fiber are $n_1=1.4595$, $n_2=1.461$ and $n_3=1.4595$. The core diameter of the single mode SMF-28 fiber is d=9.0 µm. The wavelength is 1.55 µm, which is becoming very common in the telecommunication field because an optical fiber has lower loss at this wavelength than at 1.32 µm. These parameters result in a guided mode propagation angle, $\theta_m=88.23$ degrees. By using a volume grating with a period of 1.06 µm, the propagating light can be coupled in or out normally to the fiber.

Figure 4:
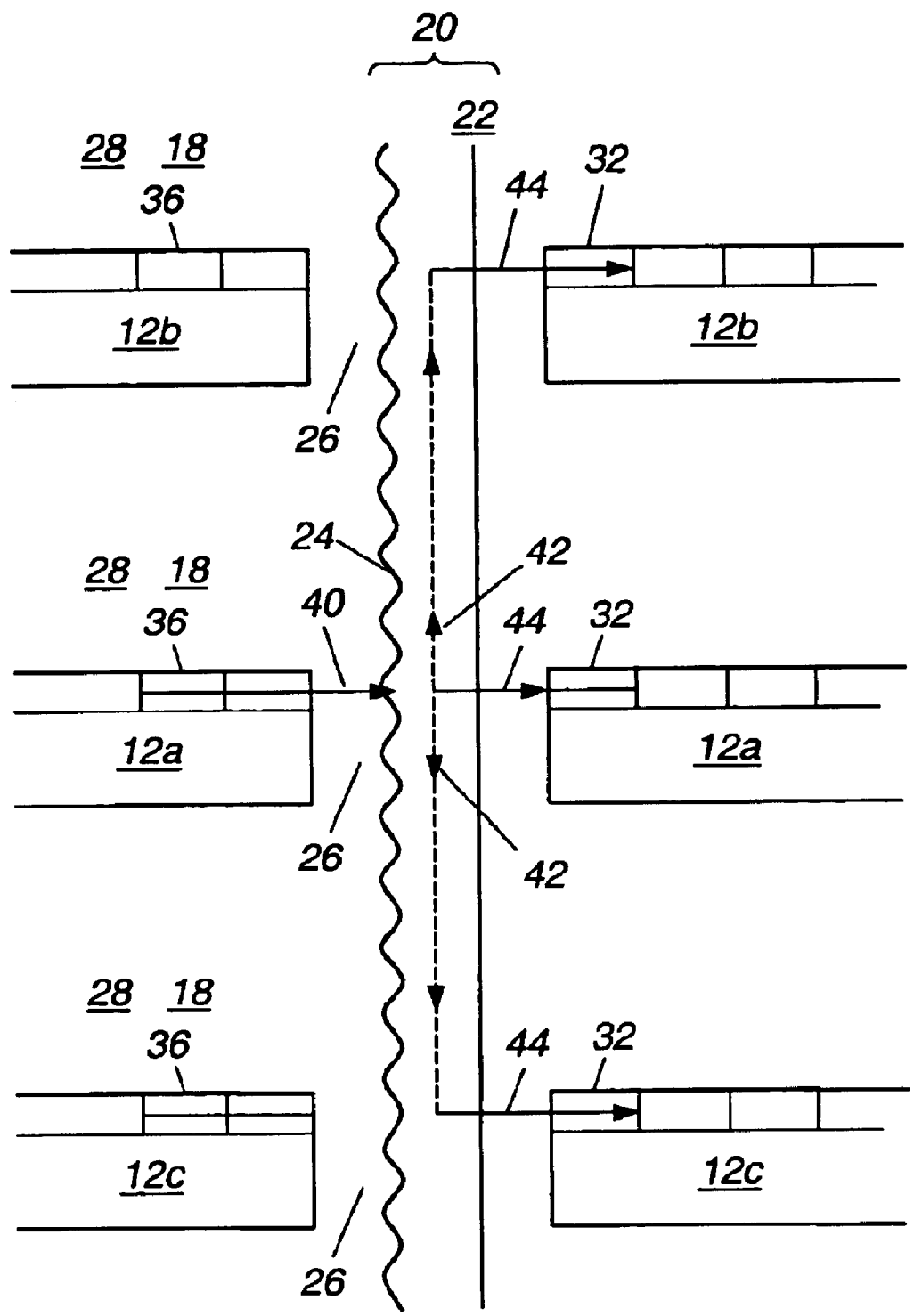
FIG. 4 is a diagrammatic view illustrating the operational interface between an integrated circuit device node and an optical data bus in accordance with the present invention.

Referring now to FIG. 4, a plurality of stacked wafers 12 are provided to illustrate the operational aspects of the present invention. More particularly, the optical transmitter 28 transmits optical signals in the form of modulated light beams 40 in the plane of a wafer 12. The transmitted beams 40 thus are normally incident on the Bragg gratings 24 on the side of the dielectric waveguide 22. The waveguide 22 is oriented perpendicular to each of the stacked wafers 12. Each grating 24 couples the normally incident transmitted light 40 bi-directionally into a propagating mode of its associated waveguide 22, which in turn sends the light 42 toward the nodes 18 in the other stacked wafers 12. A portion of the propagating light 42 is coupled out of the waveguide 22 by each grating 24, as shown by numeral 44, in a direction normal to the waveguide 22 toward the respective optical detector 32. Thus, light 42 from a transmitted optical signal is transferred to the detectors 32 on the other wafers 12. In other words, only a fraction of the light 42 is coupled out by each grating 24 so that light 42 remains in the waveguide 22 to propagate toward the next transmitter/receiver pair at the node 18 of a downstream wafer 12 in the stack. In this way, the data transmitted by a transmitter/receiver pair at a node 18 on one wafer 12, is received by the nodes 18 on all other wafers 12. Since the grating coupler 24 is designed to couple normal incident light, the light 40 is launched in both directions axially through the waveguide 24 ensuring that the wafers 12 both above and below a wafer 12 on which the light source 36 is located receive the data.

For purposes of recovering from defective wafers 12 that may exist in the stack, the optical data bus 20, as previously mentioned, does not require physical contact between optical transmission interfaces 26 and the waveguide 22, thereby allowing a connectorless interface at each node 18. Also as previously described, a grating coupler 24 that does not require critical optical alignment performs the optical coupling of light into and out of the waveguide 22. The absence of physical contact between the optical interfaces 26 and the waveguide 22, in conjunction with the liberal tolerance allowed at each node 18, enables the optical waveguide to be removed from the stack of wafers 12, and later replaced should a wafer be found defective.

Figure 5A:
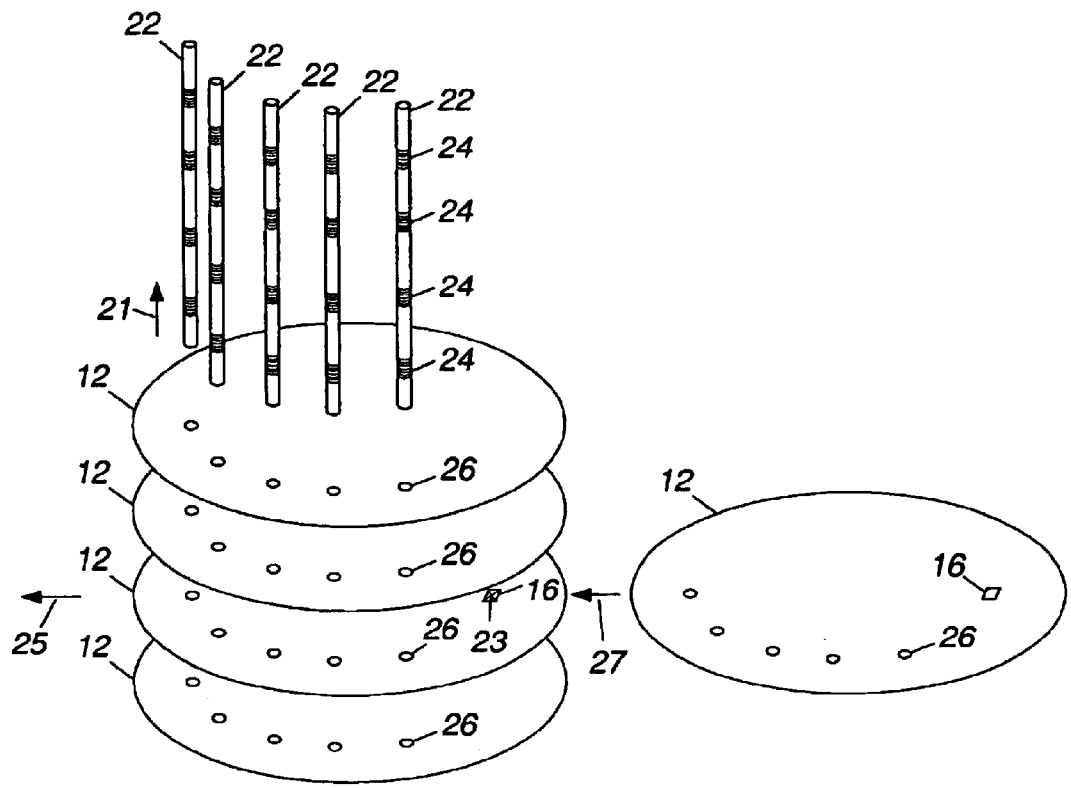
FIG. 5a is a three-dimensional view of the removal of the waveguides from a stack of wafers to allow the replacement of a defective wafer.

Referring to FIG. 5a, the waveguides 22 can be removed from the stack of wafers 12 with a common vertical motion shown by numeral 21. A temporary removal of the optical waveguides 22 allows a wafer having an onboard circuit defect 23 to be removed from the stack with a motion shown by numeral 25 and replaced with a new wafer using a motion shown by numeral 27.

Figure 5B:
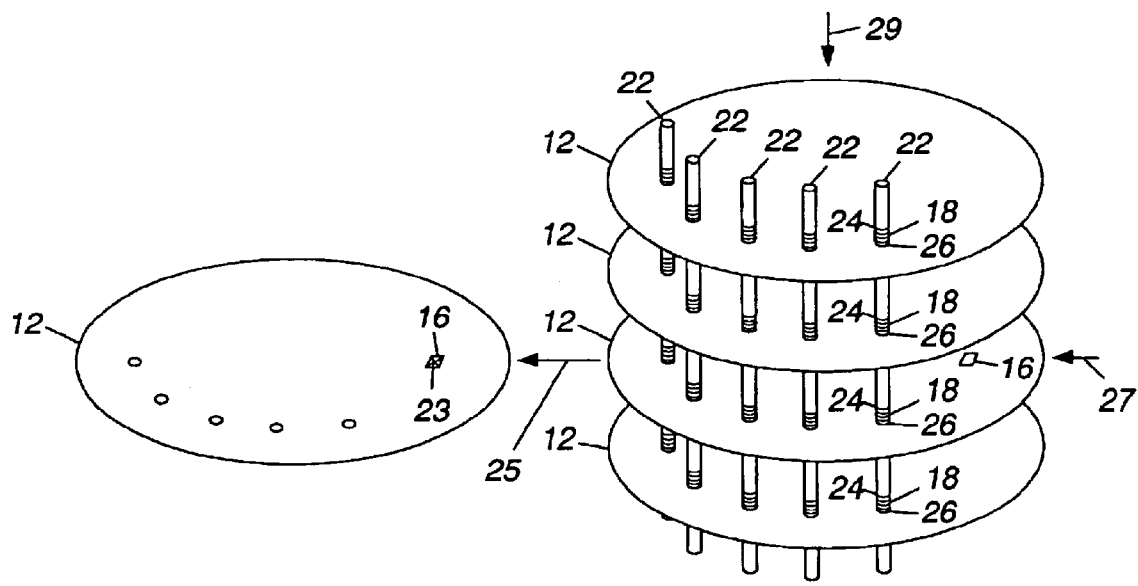
FIG. 5b is a three-dimensional view of the replacement of the waveguides after installation of a new wafer that replaces a defective wafer.

Referring to FIG. 5b, the optical waveguides 22 are then returned into position using a vertical motion 29, whereby the nodes 18 retain the connectivity that existed prior to removal of the defective wafer. Connectivity is retained because optical alignment of each of the waveguides 22 is not critical by virtue of the grating coupler 24. And as a result, by repeating this process for every wafer in which a defect is detected, a highly complex integrated circuit device, such as avionics for a spacecraft, can be assembled defect free.

It will be appreciated by those skilled in the art that the integrated circuit device 10 can provide a high-speed opto-electronic interface to an optical data bus 20 that enables optical data transfer at multi-gigabit rates between a single wafer-scale integrated wafer 12 and other external devices likewise connected to the optical data bus 20. Thus, to accomplish all the electronic functions that a satellite, or a similarly large-scale system has to perform, portions or complete sets of the system's electronic functions may be integrated on individual wafers 12, using the wafer-scale integration techniques described herein. And all such wafers 12 can be interconnected using a high-speed optical data bus architecture without compromising processing speed and efficiency.

Obviously, many modifications and variations of the present invention are possible in light of the above teachings. Thus, it is to be understood that, within the scope of the appended claims, the invention may be practiced otherwise than as specifically described above.

What is claimed is:

1. An integrated circuit device comprising:
    a plurality of wafers arranged in a stack, said plurality of wafers including an initial wafer located at one end of said stack of wafers and a final wafer located at an opposite end of said stack of wafers, each said WAFER having a first surface, a second surface opposite said first surface and an optical transmission interface extending from said first surface through to said second surface of the wafer and
    a semiconductor layer disposed on said first surface;
    a plurality of integrated circuits formed on said semiconductor layer;
    an optical data bus extending in a straight line through said optical transmission interface of each of said wafers in said stack of wafers normal to said first wafer surface, said optical data bus having first and second ends and being greater in length than the length of said stack with said first and second ends being positioned spaced respectively from said semiconductor layer of said initial wafer and from said second surface of said final wafer;
    at least one device optically coupled to said optical data bus, said at least one device being external to and spaced from said stack of wafers; and
    a node formed on said semiconductor layer in each wafer of said plurality of wafers, said node being adjacent to said optical transmission interface and a side of said optical data bus, said node having means for optically coupling said plurality of integrated circuits of a respective wafer with said optical data bus through said side of said optical data bus without being physically attached thereto to provide optical data communication between said wafers and said at least one device and permit, when desired, axial withdrawal of said optical data bus from said optical transmission interface in each wafer of said stack of wafers to permit detachment of selected wafers from said stack of wafers.

2. An integrated circuit device as recited in claim 1, wherein said optical data bus includes a plurality of couplers longitudinally spaced apart along said optical data bus, each of said couplers for translating incident optical energy propagating thereto in a direction normal to said optical data bus to optical energy propagating in opposite directions along the axis of said optical data bus and for translating the direction of propagation of a portion of incident optical energy propagating along said axis of said optical data bus to optical energy propagating in a direction normal to said axis and out said side of said optical data bus;
    said plurality of couplers being equal in number to the sum of the number of said plurality of wafers and said external devices;
    each node in said plurality of wafers being positioned in alignment with a respective one of said plurality of couplers; and
    at least one other of said plurality of couplers being optically coupled to said at least one device.

3. An integrated circuit device as recited in claim 2, wherein each of said couplers comprise a Bragg diffraction grating.

4. An integrated circuit device as recited in claim 2, wherein said at least one device comprises a plurality of devices, each of said devices being spaced from one another along said optical data bus, and wherein each of said plurality of couplers of said optical data bus are positioned adjacent a respective one of said plurality of devices.

5. An integrated circuit device as recited in claim 2, wherein said optical data bus comprises a slab of light transmissive dielectric material, said slab having a straight elongate geometry.

6. An integrated circuit device as recited in claim 1, wherein said means for optically coupling comprises:
    a transmitter having a light source for emitting a beam of light and an external modulator, wherein said light source is disposed adjacent to said external modulator and said external modulator is disposed proximate to said optical transmission interface such that said beam of light transmits said external modulator and propagates in a direction parallel to said first wafer surface and normal to said optical data bus; and
    a receiver having a detector, an amplifier and signal processing circuitry, said detector disposed adjacent, said optical transmission interface facing said light source and said optical data bus, wherein said detector detects an optical signal emitted from said optical data bus in a direction normal thereto, and converts said signal to an electrical signal that is amplified by said amplifier.

7. An integrated circuit device as recited in claim 6, wherein said light source is a hybrid element integral with said semiconductor layer.

8. An integrated circuit device as recited in claim 6, wherein said light source is epitaxial growth semiconductor material on silicon.

9. An integrated circuit device as recited in claim 6, wherein said light beam is a coherent monochromatic beam of light.

10. An integrated circuit device as recited in claim 6, wherein said external modulator is an electro absorption modulator.

11. An integrated circuit device as recited in claim 6, wherein said external modulator is a semiconductor laser diode modulator.

12. An integrated circuit device as recited in claim 11, wherein said semiconductor laser diode modulator has a discrete channel spectrum of from 1300 nanometers (nm) to 1600 nanometers (nm).

13. An integrated circuit device as recited in claim 6, wherein said external modulator is integral with said semiconductor layer.

14. An integrated circuit device as recited in claim 6, wherein said external modulator is formed of a semiconductor material selected from the group consisting of gallium arsenide (GaAs), gallium phosphide (GaP), indium phosphide (InP), and indium arsenide (InAs).

15. An integrated circuit device as recited in claim 6, wherein said external modulator is formed of a millimeter wave integrated circuit material selected from the group consisting of indium, gallium, aluminum, gallium arsenide, and indium phosphide.

16. An integrated circuit device as recited in claim 15, wherein said millimeter wave integrated circuit material is compatible with a semiconductor material selected from the group consisting of gallium arsenide (GaAs), gallium phosphide (GaP), indium phosphide (InP), and indium arsenide (InAs).

17. An integrated circuit device comprising:
a plurality of wafers, each wafer having a first surface, a second surface opposite said first surface and an optical transmission interface extending from said first wafer surface through to said second wafer surface, a semiconductor layer disposed on each said first wafer surface, and a plurality of integrated circuits formed on each said semiconductor layer, said plurality of integrated circuits including a node formed on said semiconductor layer adjacent to said optical transmission interface, said node having means for coupling optical data into and out of said plurality of integrated circuits;
said plurality of wafers being in parallel adjacent one another and aligned to define a straight stack of wafers, with said optical transmission interface of each of said plurality of wafers being aligned to define a straight path through said stack of wafers, said plurality of wafers including an initial wafer located at one end of said stack of wafers and a final wafer located at an opposite end of said stack of wafers, the first surface of said initial wafer being oriented facing away from said stack of wafers and the first surface of said final wafer being oriented facing into said stack of wafers; and
an optical data bus extending axially through said straight path and through each said optical transmission interface in said straight path normal to each said first wafer surface at each said wafer node, said optical data bus having means for coupling optical data between one said wafer node and other wafer nodes located on said wafers within the stack without being physically attached to any of said wafer nodes, to permit said optical data bus to be axially withdrawn from said stack of wafers, when desired, enabling individual wafers to be selectively withdrawn from said stack.

18. An integrated circuit device as recited in claim 17, wherein each said wafer is formed of a thermally conductive material.

19. An integrated circuit device as recited in claim 17, wherein each said wafer is formed of a material selected from the group consisting of diamond and sapphire.

20. An integrated circuit device as recited in claim 17, wherein each said semiconductor layer is formed of a material selected from the group consisting of silicon (Si), germanium (Ge), gallium arsenide (GaAs), gallium phosphide (GaP), indium phosphide (InP), and indium arsenide (InAs).

21. An integrated circuit device as recited in claim 17, wherein each said integrated circuit is an application specific integrated circuit (ASIC).

22. An integrated circuit device as recited in claim 17, wherein said means for coupling optical data into and out of said plurality of integrated circuits comprises:
a transmitter having a light source for emitting a beam of light and an external modulator, wherein said light source is disposed adjacent to said external modulator and said external modulator is disposed proximate to said optical transmission interface such that said beam of light transmits said external modulator and propagates in a direction parallel to said first wafer surface and normal to said optical data bus; and
a receiver having a detector, an amplifier and signal processing circuitry, said detector disposed adjacent said optical transmission interface facing said light source and said optical data bus, wherein said detector detects an optical signal emitted from said optical data bus in a direction normal thereto, and converts said signal to an electrical signal that is amplified by said amplifier.

23. An integrated circuit device as recited in claim 22, wherein said light source is a hybrid element integral with said semiconductor layer.

24. An integrated circuit device as recited in claim 22, wherein said light source is epitaxial growth semiconductor material on silicon.

25. An integrated circuit device as recited in claim 24, wherein said epitaxial growth semiconductor material is a material selected from the group consisting of gallium arsenide (GaAs), gallium phosphide (GaP), indium phosphide (InP), and indium arsenide (InAs).

26. An integrated circuit device as recited in claim 22, wherein said light source is a porous silicon optical emitter.

27. An integrated circuit device as recited in claim 22, wherein said light beam is a coherent monochromatic beam of light.

28. An integrated circuit device as recited in claim 22, wherein said external modulator is an electro absorption modulator.

29. An integrated circuit device as recited in claim 22, wherein said external modulator is a semiconductor laser diode modulator.

30. An integrated circuit device as recited in claim 29, wherein said semiconductor laser diode modulator has a discrete channel spectrum of from 1300 nanometers (nm) to 1600 nanometers (nm).

31. An integrated circuit device as recited in claim 22, wherein said external modulator is integral with said semiconductor layer.

32. An integrated circuit device as recited in claim 22, wherein said external modulator is formed of a semiconductor material selected from the group consisting of gallium arsenide (GaAs), gallium phosphide (GaI'), indium phosphide (InP), and indium arsenide (InAs).

33. An integrated circuit device comprising:
a plurality of wafers arranged in a stack, said plurality of wafers including an initial wafer located at one end of said stack of wafers and a final wafer located at an opposite end of said stack of wafers, each said wafer having a first surface, and a second surface opposite said first surface;

a semiconductor layer disposed on said first wafer surface;

a plurality of integrated circuits formed on said semiconductor layer; an optical data bus extending in a straight line along an edge of said stack of wafers normal to said first surface of each wafer in said stack of wafers, said optical data bus having first and second ends and a side and being greater in length that the distance between the top of said semiconductor layer of said initial wafer and said second surface of said final wafer;

said optical data bus being physically unattached to individual wafers of said plurality of wafers;

a plurality of external devices coupled to said optical data bus; and each wafer of said plurality of wafers including a node formed on said semiconductor layer of the respective wafer adjacent to said wafer edge and a side of said optical data bus, said node including means for optically coupling said plurality of integrated circuits and said optical data bus;

said optical data bus including a plurality of couplers longitudinally spaced apart along said optical data bus, each of said couplers for translating incident optical energy propagating thereto in a direction normal to said optical data bus to optical energy propagating in opposite directions along the axis of said optical data bus and for translating the direction of propagation of a portion of optical energy propagating along said axis of said optical data bus incident thereon to optical energy propagating in a direction normal to said axis out a side of said optical data bus;

a first portion of said plurality of couplers being positioned in alignment with respective ones of said nodes; and the remainder of said plurality of couplers being optically coupled to respective ones of said plurality of external devices.

34. An integrated circuit device as recited in claim 33, wherein said means for optically coupling comprises:

a transmitter having a light source for emitting a beam of light and an external modulator, wherein said light source is disposed adjacent to said external modulator and said external modulator is disposed proximate to said wafer edge such that said beam of light transmits said external modulator and propagates in a direction parallel to said first wafer surface and normal to said optical data bus; and a receiver having a detector, an amplifier and signal processing circuitry, said detector disposed adjacent said wafer edge facing said light source and said optical data bus, wherein said detector detects an optical signal emitted from said optical data bus in a direction normal thereto, and converts said signal to an electrical signal that is amplified by said amplifier.

35. An integrated circuit device comprising:

a plurality of wafers adjacently stacked, each wafer having a first surface, a second surface opposite said first surface, a semiconductor layer disposed on each said first wafer surface, and a plurality of integrated circuits formed on each said semiconductor layer, said plurality of integrated circuits including a node formed on said semiconductor layer adjacent to an edge of said wafer, said node having means for coupling optical data into and out of said plurality of integrated circuits;

a straight optical data bus extending axially in a straight path through each said wafer edge normal to each said first wafer surface at each said wafer node without being attached to said wafer edge, said optical data bus having means for coupling optical data between one said wafer node and other wafer nodes located on said wafers within the stack.

36. An integrated circuit device as recited in claim 35, wherein said means for coupling optical data into and out of said plurality of integrated circuits comprises:

a transmitter having a light source for emitting a beam of light and an external modulator, wherein said light source is disposed adjacent to said external modulator and said external modulator is disposed proximate to said wafer edge such that said beam of light transmits said external modulator and propagates in a direction parallel to said first wafer surface and normal to said optical data bus; and a receiver having a detector, an amplifier and signal processing circuitry, said detector disposed adjacent said wafer edge facing said light source and said optical data bus, wherein said detector detects an optical signal emitted from said optical data bus in a direction normal thereto, and converts said signal to an electrical signal that is amplified by said amplifier.

37. An integrated circuit device as recited in claim 3, wherein said at least one device comprises a plurality of devices, each of said devices being spaced from one another along said optical data bus, and wherein each of said plurality of said couplers of said optical data bus are positioned adjacent a respective one of said plurality of devices.

38. An integrated circuit device as recited in claim 37, wherein said optical data bus comprises a slab of light transmissive dielectric material, said slab having a straight elongate geometry.

* * * * *